US006856351B1

United States Patent
Weisfield

(10) Patent No.: US 6,856,351 B1
(45) Date of Patent: Feb. 15, 2005

(54) DEVICE AND METHOD FOR REDUCING LAG AND BLOOMING IN AMORPHOUS SILICON SENSOR ARRAYS

(75) Inventor: Richard L. Weisfield, Los Altos, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/397,040

(22) Filed: Sep. 16, 1999

(51) Int. Cl.[7] .......................... H04N 3/14; H04N 5/335
(52) U.S. Cl. ...................................... 348/310; 348/302
(58) Field of Search ................................ 348/302, 306, 348/310, 313–314, 241

(56) References Cited

U.S. PATENT DOCUMENTS 4,866,293 A * 9/1989 Nakamura et al. .......... 348/302
5,831,258 A * 11/1998 Street ....................... 250/208.1

OTHER PUBLICATIONS

Tsukamoto et al., "Development and evaluation of a large–area selenium–based flat panel detector for real–time radiography and fluoroscopy", SPIE Conference on Physics, Feb. 1999, pp. 14–23.

* cited by examiner

Primary Examiner—Wendy R. Garber
Assistant Examiner—Kelly L. Jerabek
(74) Attorney, Agent, or Firm—Finnegan, Henderson, Farabow, Garrett & Dunner, LLP

(57) ABSTRACT

A clamping circuit including a clamping diode, a bias line, and a clamp line is incorporated into a pixel circuit of amorphous silicon sensor arrays. The clamp diode in each pixel prevents the voltage across the photodiode from dropping below a specific threshold. By keeping the photodiode under reverse bias even under conditions that may otherwise saturate the pixel, image lag is reduced. In full fill factor amorphous silicon sensor arrays, a clamping circuit includes a clamp TFT, a bias plane, a clamp line, and a drain line. The clamp TFT reduces lag and blooming by draining off excess current developed under overexposure conditions. A method to globally reset a sensor array and a method to test and repair a TFT matrix in full fill factor sensor arrays without damaging the overlying collection electrode and sensor layer are also provided.

7 Claims, 4 Drawing Sheets

DEVICE AND METHOD FOR REDUCING LAG AND BLOOMING IN AMORPHOUS SILICON SENSOR ARRAYS

FIELD OF THE INVENTION

The present invention relates generally to amorphous silicon image arrays, and more particularly to amorphous silicon image arrays that reduce lag and blooming.

BACKGROUND OF THE INVENTION

Conventional amorphous silicon (a-Si) image arrays typically comprise an array of pixels and an associated matrix of rows and columns of address lines to electrically access each pixel. Each pixel has a photodiode and thin film transistor (TFT). The gate of each TFT is coupled to a scan line and the source (or alternatively the drain) of each TFT is coupled to a data line. These address lines are used to read the signal from respective pixel photodiodes.

Image lag affects a-Si image sensors when a pixel is exposed to sufficient illumination to populate deep traps in the a-Si, which traps release charge long after the pixel has been exposed. The effect is greatly exacerbated when a photodiode is exposed to sufficient intensity such that the voltage across the photodiode drops to zero and the built-in field collapses. Under these conditions, charged carriers diffuse throughout the bulk material in the diode and distort the built-in field characteristics. When the diode is returned to the dark, it takes many seconds for the carriers distributed among the deep traps to emit and low leakage currents to be restored. This results in a ghost image that remains for several tens of seconds after the image was taken.

One prior art solution to reduce image lag is to reduce the density of bulk traps in the diode material. The trap density in a-Si, however, can only be reduced to a certain level through materials engineering. This limit is on the order of about $3-5 \times 10^{15}$ cm$^{-3}$.

Another prior art solution is to increase the built-in field. This can be done by using a high built-in potential layer such as microcrystalline P+ doped a-Si or by reducing the thickness of the photodiode. Microcrystalline P+ doped a-Si, however, only adds about 0.5 V to the built-in potential. Using a large built-in potential improves image lag, but under high enough exposure conditions the voltage across the diode will always drop to zero and increase image lag. Thus, the benefit of reduced image lag provided by increasing the effective field across the diode must be weighed against the inevitable increase in sensor dark current and, in the case of thinner photodiodes, increased diode capacitance and increased pixel noise.

To achieve higher resolution, full fill factor a-Si image arrays extend the sensor into a continuous layer on top of the array. In contrast to a conventional image array in which each pixel is defined by a stand alone photodiode, a full fill factor a-Si image array improves the pixel fill factor by using continuous layers of a-Si and P+ doped a-Si. As shown in FIG. 1, the pixels in a full fill factor array 10 are defined only by collection electrodes comprising patterned metal contacts 20 and N+ doped a-Si 30. The full fill factor sensor array, further includes continuous layers of intrinsic a-Si 40, P+ doped a-Si 50, and indium-tin-oxide 60 (ITO). The device comprises a plurality of pixels coupled to a plurality of gate lines and data lines (not shown). Gate lines and data lines are typically disposed in the array substantially perpendicular to each other in a matrix arrangement such that data lines overlie gate lines at each pixel in a crossover region. Each pixel also includes a TFT 70. The gate lines are coupled to the gate electrodes of TFT 70 and the signals on these lines are used to cause TFT 70 to become conductive or non-conductive. The data lines are coupled to the drains of TFT 70.

Full fill factor image arrays also suffer from image lag. In addition to image lag, however, full fill factor image arrays also suffer blooming. Blooming occurs when a pixel is strongly illuminated and the charge moves laterally in the continuous a-Si layer. As the pixel saturates, the surface charges up to the bias voltage $V_{bias}$ screening the vertical field. The only direction for the charge to move is laterally towards higher, less exposed regions. This lateral movement of charge results in adjacent pixels being activated by the laterally spread charge. These adjacent pixels are read-out as having been exposed when, in fact, only the strongly illuminated pixel was exposed.

Conventional TFT full fill factor sensor arrays also lack a means for testing the TFT matrix prior to depositing the overlying collection electrode and sensor layer. One solution is to add storage capacitors at each pixel and charge them through the data lines or by an electron-beam. The charge at each TFT in the array could then be measured. This solution, however, requires a capacitor at each pixel making it harder to form smaller pixels. Another disadvantage is that the added capacitors add increased pixel noise to the electronic noise of the array.

In light of the foregoing, there is a need for a method and device to reduce the image lag and blooming in a-Si sensor arrays. There is also a need for a method and device for testing the TFT matrix and effecting repairs without damaging the overlying collection electrodes and sensor layer.

SUMMARY OF THE INVENTION

Accordingly, the present invention is directed to a device and method to reduce lag and blooming in amorphous silicon sensor arrays that substantially obviates one or more of the problems due to limitations and disadvantages of the related art.

In accordance with the purposes of the present invention, as embodied and broadly described, the invention provides an image array having a plurality of pixels disposed in rows and columns, wherein each pixel includes a photodiode, a thin film transistor (TFT), and a clamping diode. The image array further includes a plurality of data lines, a plurality of gate lines, a plurality of bias lines carrying a bias voltage, and a plurality of clamp lines electrically interconnecting the clamping diodes in individual ones of the rows or columns of the array, wherein the clamp lines carry a clamping voltage.

According to another aspect of the present invention, a clamping circuit in a sensor array is provided that reduces lag including a gate line, a data line, a bias line carrying a bias voltage $V_{bias,}$ and a clamp line carrying a clamping voltage $V_{clamp}$. The clamping circuit further includes a TFT having a source, a drain, and a gate, wherein the source or drain of the TFT is connected to the data line and the gate is connected to the gate line. The clamping circuit further includes a photodiode having an anode, a cathode, and a storage node, wherein the anode is connected to the other of the source or drain of the TFT and the cathode is connected to the bias line. The clamping circuit further includes a clamp diode having an anode and cathode, wherein the clamp diode anode is connected to the clamp line and the clamp diode cathode is connected to the storage node of the photodiode.

According to another aspect of the present invention, a full fill factor image array is provided having a plurality of pixels disposed in rows and columns, wherein each pixel includes a photodiode, a first TFT, and a second TFT. The image array further includes a plurality of data lines, a plurality of gate lines, a bias plane carrying a bias voltage. The full fill factor image array further includes a plurality of clamp lines electrically interconnecting the second TFT of each pixel of individual ones of the rows or columns of the array, wherein the clamp lines carry a clamping voltage. The full fill image array also includes a plurality of drain lines electrically interconnecting the plurality of data lines, wherein the drain lines carry a drain voltage, and a sensor layer.

According to another aspect of the present invention, a clamping circuit in a full fill factor sensor array is provided that reduces lag and blooming including a gate line, a data line, a bias plane carrying a bias voltage, a clamp line carrying a clamping voltage, a drain line carrying a drain voltage, a switching TFT having a source, a drain, and a gate, wherein the source or drain of the switching TFT is connected to the data line and the gate is connected to the gate line. The clamping circuit further includes a photodiode having an anode, a cathode, and a storage node, wherein the anode is connected to the other of the source or drain of the switching TFT and the cathode is connected to the bias plane. The clamping circuit further includes a clamp TFT having a source, a drain, and a gate, wherein the gate of the clamp TFT is connected to the clamp line, the source or drain of the clamp diode is connected to the storage node of the photodiode, and the other of the source or drain of the clamp TFT is connected to the drain line.

According to another aspect of the present invention, a method is provided for testing an array of TFTs during the fabrication of a full fill factor sensor array including the steps of providing a plurality of pixel circuits including a switching TFT having a threshold voltage and a clamping TFT in each of said pixel circuits, providing a plurality of data lines having a potential supplied by a charge amplifier, setting a clamp voltage to a DC gate voltage higher than the threshold voltage of the switching TFT, setting a drain voltage close to the potential of the data line, and measuring a current flowing through the clamp TFTs and the switching TFTs each time the switching TFTs are on.

According to another aspect of the present invention, a method is provided of globally resetting a sensor array including the steps of providing a plurality of pixel circuits disposed in rows and columns, wherein each pixel circuit includes a photodiode have a storage node to store a pixel charge, a clamping TFT, wherein the clamping TFTs of individual rows or columns are electrically interconnected by clamp lines carrying a clamping voltage, and a switching TFT, wherein the switching TFTs of individual other rows or columns are electrically interconnected by drain lines. The method further including the step of pulsing the clamping voltage at a value to cause the pixel charge to be dumped to the drain lines.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
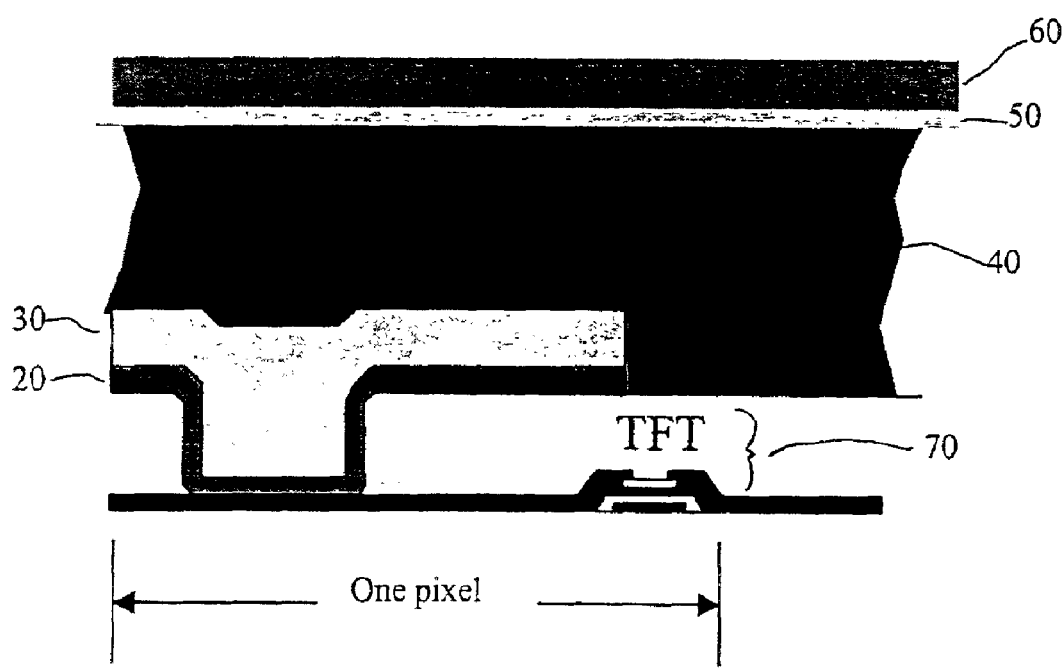
FIG. 1 is schematic cross sectional view of a prior art full fill factor sensor array.
Figure 2:
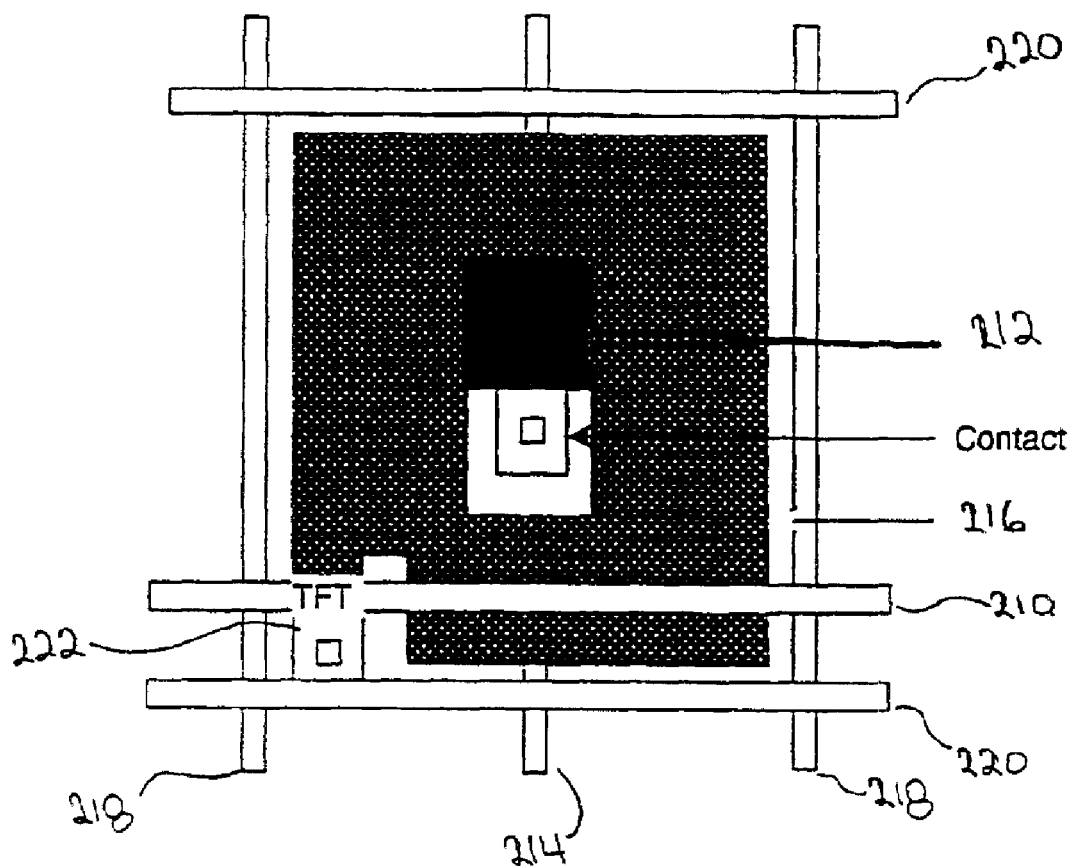
FIG. 2 is a pixel layout including a clamping diode consistent with one embodiment of the present invention.

FIG. 2 shows a pixel layout of an image array including a clamping diode consistent with one embodiment of the invention. In addition to the conventional data lines 220, gate lines 218, TFT 222, and photodiode 216, the pixel of the invention includes a common bias line 210 and clamp line 214 running between each gate 218 and data line 220. It also includes a clamping diode 212 connected between the drain line and the pixel storage node.

The clamping diode 212 reduces image lag by preventing the voltage across the photodiode 216 from dropping below a specific threshold. Thus, even when the photodiode 216 is subject to illumination that would normally saturate the pixel, the photodiode remains under reverse bias.

Figure 3:
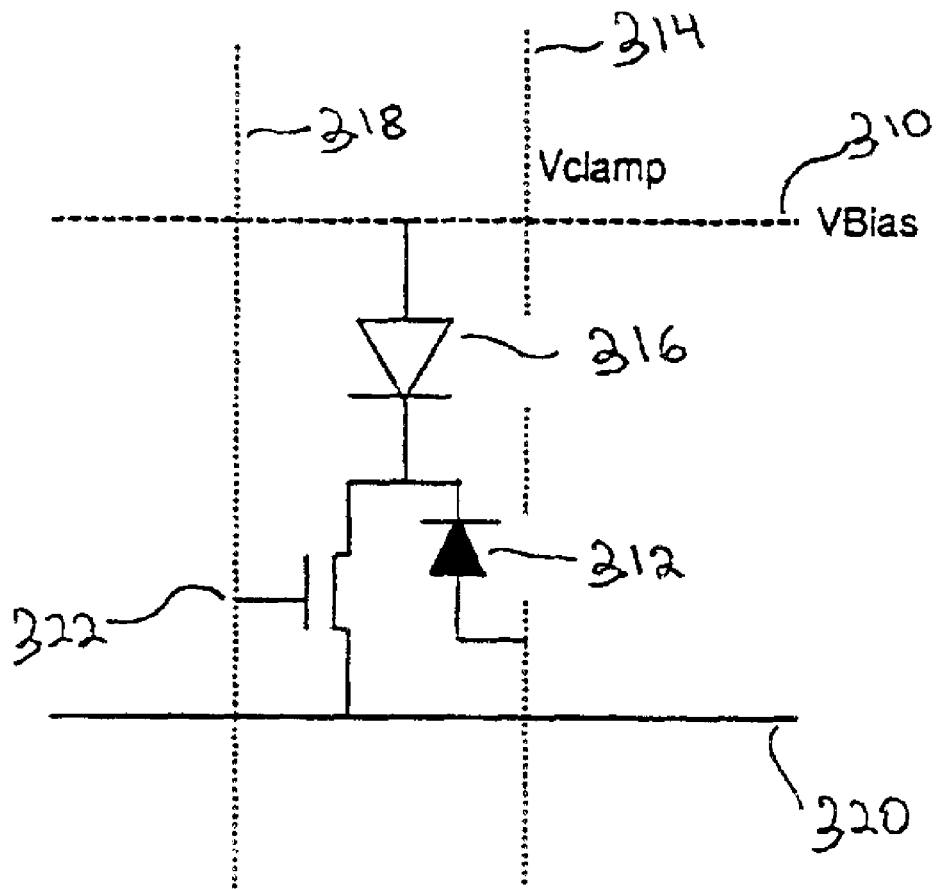
FIG. 3 shows a pixel circuit including a clamping diode consistent with an embodiment of the present invention.

FIG. 3 depicts the pixel circuit consistent with one embodiment of the present invention. The pixel circuit includes a gate line 318, a data line 320, a bias line 310 carrying a bias voltage $V_{bias}$, and a clamp line 314 carrying a clamping voltage $V_{clamp}$. The anode of photodiode 316 is connected to bias line 310. The cathode of photodiode 316 is connected to the drain (or alternatively the source) of TFT 322. The source (or alternatively the drain) of TFT 322 is connected to data line 320. The gate of TFT 322 is connect to gate line 318. The pixel circuit further includes a clamp diode 312 whose cathode is connected to the storage node of the photodiode 316. The anode of clamp diode 312 is connected to clamp line 314.

In this configuration, the bias line 310 has a bias voltage $V_{bias}$ of, for example, −8 to −10 V to promote charge collection efficiency. A clamping voltage $V_{clamp}$ of, for example, −4 to −5 V with respect to the virtual ground of the data line across the clamping line 314 keeps the diode 312 under reverse bias regardless of the illumination level. To accommodate any excess current, diode 312 may switch into forward bias of about 0.1 V. The photodiode itself maintains several volts of reverse bias, even under strong illumination, which allows the pixel to recover from any illumination level without significant lag.

Figure 4:
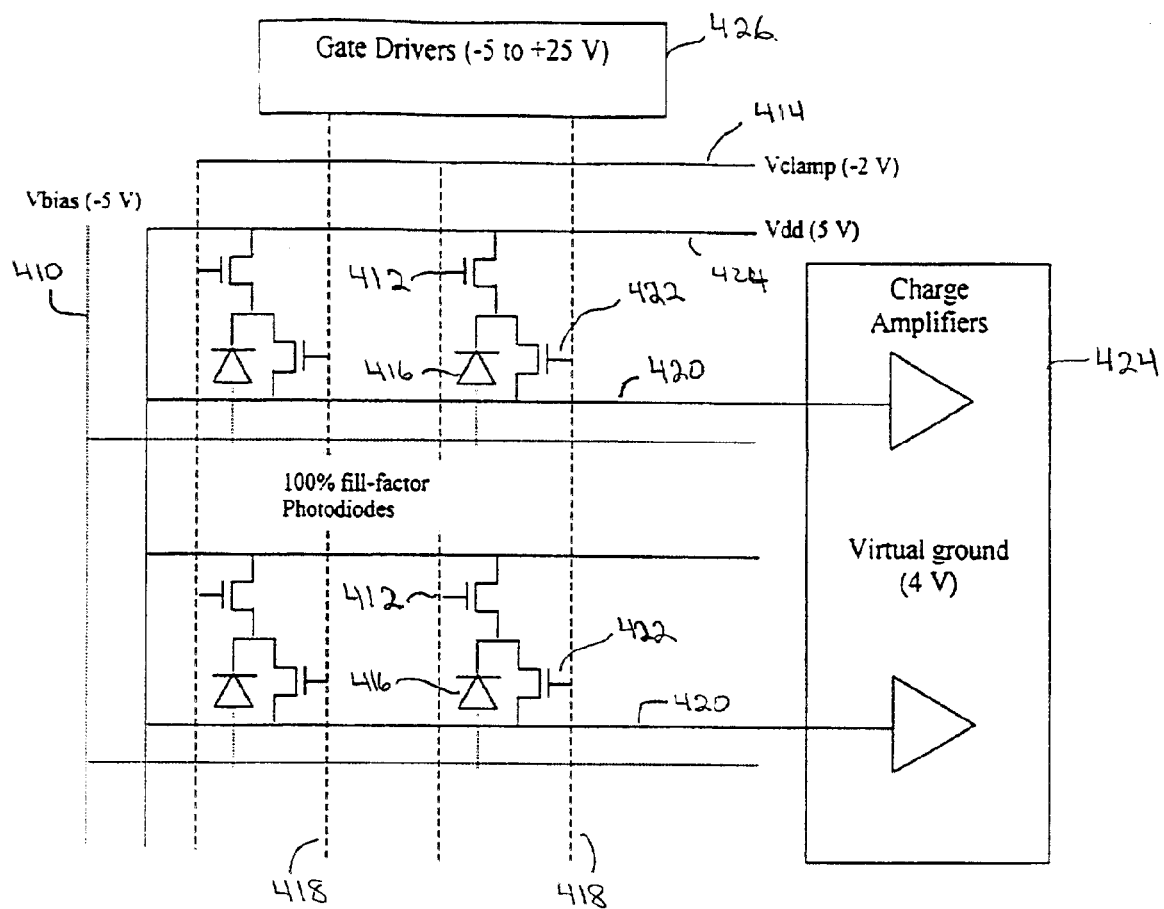
FIG. 4 shows a pixel circuit array including clamping TFTs for a full fill factor sensor consistent with an embodiment of the present invention

A pixel circuit array for a full fill factor sensor is shown in FIG. 4. A pixel circuit of this embodiment includes a gate line 418, a data line 420, a bias plane 410 carrying a bias voltage $V_{bias}$, a clamp line 414 carrying a clamping voltage $V_{clamp}$, and a drain line 424 carrying a drain voltage $V_{dd}$. The anode of photodiode 416 is connected to bias plane 410. The cathode of photodiode 416 is connected to the drain (or alternatively the source) of switching TFT 422. The source (or alternatively the drain) of switching TFT 422 is connected to data line 420. The gate of switching TFT 422 is connect to gate line 418. The pixel circuit further includes a clamping TFT 412. The gate of clamping TFT 412 is connected to clamp line 414. The source (or alternatively the drain) of clamping TFT 412 is connected to the pixel storage node of photodiode 416. The drain (or alternatively the source) of clamping TFT 412 is connected to drain line 422.

The sensor also includes, for example, a collection electrode made of metal and N+ a-Si patterned over each pixel (not shown). It further includes continuous layers of undoped a-Si and P+ doped a-Si (not shown) covering the active area of the array. A film of indium tin oxide (ITO) covering the sensor layer is provided for applying the bias voltage.

A drain voltage should preferably be higher than the clamping voltage by at least 3 V in order to shut off clamping TFT in the absence of photocurrent. The drain voltage should also preferably be higher than the voltage of the virtual ground of the data line. Additionally, the clamping voltage is preferably set to a value a few volts above the bias voltage $V_{bias}$ which is typically −5V. So, for example, the clamping voltage $V_{clamp}$ can be set to about −2 V and the drain voltage $V_{dd}$ to about 5V. The gate voltage from gate driver 426 preferably switches between an off voltage of −5 V and +25 V, where $V_{off}$ must be several volts below the bias voltage and an on voltage $V_{on}$ that must be large enough to transfer the charge from the photodiode to the data line in a few microseconds. The charge from the photodiode should preferably be transferred in less than about 10 microseconds.

In the photodiode of the present invention, no current flows when the photodiode is not illuminated. In this situation, both the switching TFTs 422 and clamping TFTs 412 are turned off. As the illumination and the corresponding current increases, the pixel storage voltage decreases. As long as the pixel voltage remains a few volts above $V_{clamp}$, the switching TFT is turned on. When the photodiode is exposed to excessive levels of illumination, however, the pixel voltage charges to a level close to that of the clamp voltage. This causes the clamp TFT 412 to turn on in such a way as to drain off excessive current. Since the TFT current increases very steeply with gate voltage, the circuit can handle several orders of magnitude of overexposure without having the photodiode go into forward bias. The pixel recovery will occur as rapidly as it takes the TFT and photodiode to relax back to a low dark current condition. This may take several seconds for the pixel according to the present invention compared to tens of seconds for a conventional saturated photodiode.

The pixel configuration shown in FIG. 4 also reduces blooming in full fill factor sensor arrays. Blooming occurs when the surface charge builds up to $V_{bias}$ in response to strong illumination. This screens the vertical field, so that current can only flow laterally towards higher potential, less exposed regions. In the clamping circuit of FIG. 4, the surface will never charge more negatively than the claim potential, so there will always be a larger vertical field than lateral field to drain off excess charge.

Having clamping TFT 412 in the pixel circuit also provides a way to test the TFT matrix and effect repairs without damaging the overlying collection electrodes and sensor layer. Prior to deposition of the collection electrodes and the sensor layer, the current in clamp TFT 412 and switching TFT 422 can be measured by, for example, setting $V_{clamp}$ to a high DC voltage and setting $V_{dd}$ to a voltage slightly below the virtual ground of the charge amplifier 424. Using, for example, a $V_{clamp}$ of 15 to 25 volts and a $V_{dd}$ of about 3.5 V, the current flowing through the clamp TFT 412 and the switching TFT 422 can be measured each time the switching TFT 422 is pulsed on. The ability of clamp TFT 412 to turn off can also be tested by repeating the test with $V_{clamp}$ set to its off condition. In this case no signal should be measured. If any repairs are required, they can be made easily since the TFT matrix is fully exposed at this point in the fabrication process.

The clamp TFT 412 of the present invention can also provide the function of a global reset of the sensor array. This function may be used, for example, when an exposure is required on demand and the scanning of the gate lines 418 needs to be stopped immediately and the sensor readied for integrating the next exposure. Scanning through a large array of gate lines can take as long as 20 msec due to the switching speed of each gate driver 426. By pulsing the clamp voltage at a high value, all the pixel charge can be dumped to $V_{dd}$ in a much shorter time. The time will be limited by the speed with which the clamp voltage can be switched high, since it will have high capacitance, approximately 200 nF for a large array. In order to switch it in, for example, 10 msec, the current required is 200 nF×30 V/10 μsec=0.6 A provided the appropriate power is available to the clamp voltage driver.

It will be apparent to those skilled in the art that various modifications and variations can be made in the clamping circuit and the method for testing a TFT array of the present invention without departing from the spirit or scope of the invention. Thus, it is intended that the present invention cover the modifications and variations of this invention provided they come within the scope of the appended claims and their equivalents.

What is claimed is:

1. An image array having a plurality of pixels disposed in rows and columns, wherein each pixel includes a photodiode, a thin film transistor (TFT), and a clamping diode, the image array further comprising:

a plurality of data lines, each of the plurality of data lines coupled to each of a source or a drain of the thin film transistor of a row or a column of pixels;

a plurality of gate lines, each of the plurality of gate lines coupled to each of a gate of the thin film transistor of a column or a row of pixels;

a plurality of bias lines carrying a bias voltage, each of the plurality of bias lines coupled to each of an anode of the photodiode of the pixels in a row or a column of pixels; and a plurality of clamp lines electrically interconnecting the clamping diodes in individual ones of the rows or columns of the array, wherein the clamp lines carry a clamping voltage, wherein the clamping diode in each pixel is electrically connected between a storage node of the photodiode and the clamp line.

2. The image array of claim 1, wherein the clamping voltage keeps the photodiode under reverse bias.

3. The image array of claim 2, wherein the clamping voltage is between about −4 to −5 V with respect to the potential of the data line.

4. The image array of claim 1, wherein the clamping diode has a forward bias when the photodiode becomes overexposed.

5. The image array of claim 4, wherein the clamping diode has a forward bias of about 0.1 V at the initial stages of overexposure.

6. The image array of claim 1, wherein the bias voltage is about −8 to −10 volts.

7. A clamping circuit in a sensor array that reduces lag comprising:
- a gate line;
- a data line;
- a bias line carrying a bias voltage $V_{bias}$;
- a clamp line carrying a clamping voltage $V_{clamp}$;
- a TFT having a source, a drain, and a gate, wherein the source or drain of the TFT is connected to the data line and the gate is connected to the gate line;
- a photodiode having an anode, and a storage node, wherein the storage node is connected to the other of the source or drain of the TFT and the anode is connected to the bias line; and
- a clamp diode having an anode and cathode, wherein the clamp diode anode is connected to the clamp line and the clamp diode cathode is connected to the storage node of the photodiode.

* * * * *